United States Patent [19]
Okada et al.

[11] Patent Number: 5,345,204
[45] Date of Patent: Sep. 6, 1994

[54] MAGNETOSTATIC WAVE RESONATOR HAVING AT LEAST ONE RING CONDUCTOR

[75] Inventors: Takekazu Okada; Satoru Shinmura; Fumio Kanaya, all of Nagaokakyo, Japan

[73] Assignee: Murata Manufacturing Co., Ltd., Kyoto, Japan

[21] Appl. No.: 14,433

[22] Filed: Feb. 5, 1993

[30] Foreign Application Priority Data

Feb. 12, 1992 [JP] Japan .................................... 4-59463

[51] Int. Cl.$^5$ ............................................ H01P 1/215
[52] U.S. Cl. ............................. 333/219.2; 333/202
[58] Field of Search ............... 333/202, 204, 205, 219, 333/219.2, 235

[56] References Cited

U.S. PATENT DOCUMENTS

| | | | |
|---|---|---|---|
| 4,547,754 | 10/1985 | Murakami et al. | 333/219.2 |
| 4,945,324 | 7/1990 | Murakami et al. | 333/205 X |
| 4,983,937 | 1/1991 | Kinoshita et al. | 333/219.2 X |
| 4,992,760 | 2/1991 | Takeda et al. | 333/219.2 |

FOREIGN PATENT DOCUMENTS 0275201  11/1988  Japan ............................ 333/219.2

*Primary Examiner*—Seungsook Ham
*Attorney, Agent, or Firm*—Jordan and Hamburg

[57] ABSTRACT

A magnetostatic wave resonator includes a YIG thin film. On one main surface of the YIG thin film, three circular conductors having different radii are disposed on concentric circles whose centers are the center of the YIG thin film. Furthermore, on the YIG thin film, two transducers are disposed so as to intersect with each other at right angles at the center of the YIG thin film and to connect magnetically to the YIG thin film.

7 Claims, 6 Drawing Sheets

(1,1) MODE (1,3) MODE

MAGNETOSTATIC WAVE RESONATOR HAVING AT LEAST ONE RING CONDUCTOR

BACKGROUND OF THE INVENTION

Field of the Invention

The present invention relates to a magnetostatic wave resonator, and particularly to a magnetostatic wave resonator used, for example, in a band-pass filter or the like.

Description of the Prior Art

FIG. 9 is a perspective view showing a conventional band-pass filter which is a background of the present invention, and is shown in the "Magnetostatic Wave and Magnetostatic Wave-Optic Filter Technology" in MICROWAVE JOURNAL, NOVEMBER, 1990. Though 4-stage magnetostatic wave resonators $1a$, $1b$, $1c$ and $1d$ are used in the band-pass filter shown in FIG. 9, its basis is, for example, a single-stage magnetostatic wave resonator shown in FIG. 10.

The magnetostatic wave resonator 1 shown in FIG. 10 includes a GGG (gadolinium gallium garnet) substrate 2 having a square plane, on one main surface of the GGG substrate 2, a YIG (yttrium iron garnet) thin film 3 is formed, for example, by means of LPE (liquid phase epitaxy). Furthermore, on the YIG thin film 3, two single-wire transducers $4a$ and $4b$ are disposed so as to intersect with each other at right angles and to connect magnetically to the YIG thin film 3.

Next, the operation of the magnetostatic wave resonator 1 shown in FIG. 10 is described.

To the YIG thin film 3 of the magnetostatic wave resonator 1, a d.c. magnetic field is applied from the outside, in a direction z shown in FIG. 10 or in a direction intersecting at right angles with the surface of the YIG thin film 3. When a high-frequency signal is inputted to one transducer $4a$ at this state, a high-frequency electric current flows through the transducer $4a$ and a high-frequency magnetic field is excited around thereof. By the high-frequency magnetic field, a magnetostatic wave is excited in the YIG thin film 3. At this time, the magnetostatic wave starts to resonate at a frequency decided by the size, the thickness and the saturated magnetization of the YIG thin film 3 and the intensity of the d.c. magnetic field applied thereto. The other transducer $4b$ converts the magnetostatic wave excited in the YIG thin film 3 inversely into a high-frequency signal and outputs the high-frequency signal. Thus the magnetostatic wave resonator 1 operates as a resonator.

In the magnetostatic wave resonator 1, however, as showing its frequency characteristic in FIG. 11, not only a main mode but also an unnecessary higher mode is excited. The excitation of the unnecessary higher mode is due to the resonance of higher standing wave of the magnetostatic wave, thus when the magnetostatic wave resonator 1 is operated as a filter, the attenuation quantity outside a passband is deteriorated.

As means for suppressing the unnecessary higher mode, a magnetostatic wave resonator wherein the higher mode is suppressed is disclosed in "Magnetostatic wave resonator using microstrip disk" of C-99 at all Japan Spring Session 1991 of Japan Electronic Information and Communication Association.

FIG. 12 is a perspective view showing the conventional magnetostatic wave resonator wherein the higher mode is suppressed. In the magnetostatic wave resonator 1 shown in FIG. 12, on a surface of a YIG thin film 3, a metal disk 5 is formed, for example, by means of etching. In the magnetostatic wave resonator 1, a magnetostatic wave energy is confined by the metal disk 5 in the YIG thin film 3 thereunder, thereby operating as a resonator. In this case, in the magnetostatic wave resonator 1, the confining operation is weak against the higher mode, as a result, the higher mode is suppressed.

In the magnetostatic wave resonator 1 shown in FIG. 12, however, as showing its frequency characteristic in FIG. 13, though the higher mode is suppressed than that of the magnetostatic wave resonator shown in FIG. 10, a higher mode level is still high.

On the other hand, when neglecting an increase of insertion losses, though it is possible to suppress the higher mode, usually the increase of insertion losses is not desirable.

SUMMARY OF THE INVENTION

It is therefore a primary object of the present invention to provide a magnetostatic wave resonator in which a suppressing degree of the higher mode is high and an increase of insertion losses is small.

The present invention is directed to a magnetostatic wave resonator comprising a ferrimagnetic base, a ring conductor formed on one main surface of the ferrimagnetic base, and at least two transducers intersected with each other on the main surface of the ferrimagnetic base and connected magnetically to the ferrimagnetic base.

In the ferrimagnetic base, not only a main mode standing wave of a magnetostatic wave, but also a higher mode standing wave is excited. The higher mode standing wave of the magnetostatic wave is suppressed by the ring conductor.

According to the present invention, since the higher mode standing wave of the magnetostatic wave is suppressed, the magnetostatic wave resonator in which a suppressing degree of the higher mode is high and an increase of insertion losses is small is obtained.

The above and other objects, features, aspects and advantages of the present invention will become more apparent from the following detailed description of the embodiments with reference to the accompanying drawings.

DESCRIPTION OF THE PREFERRED EMBODIMENTS

Figure 1:
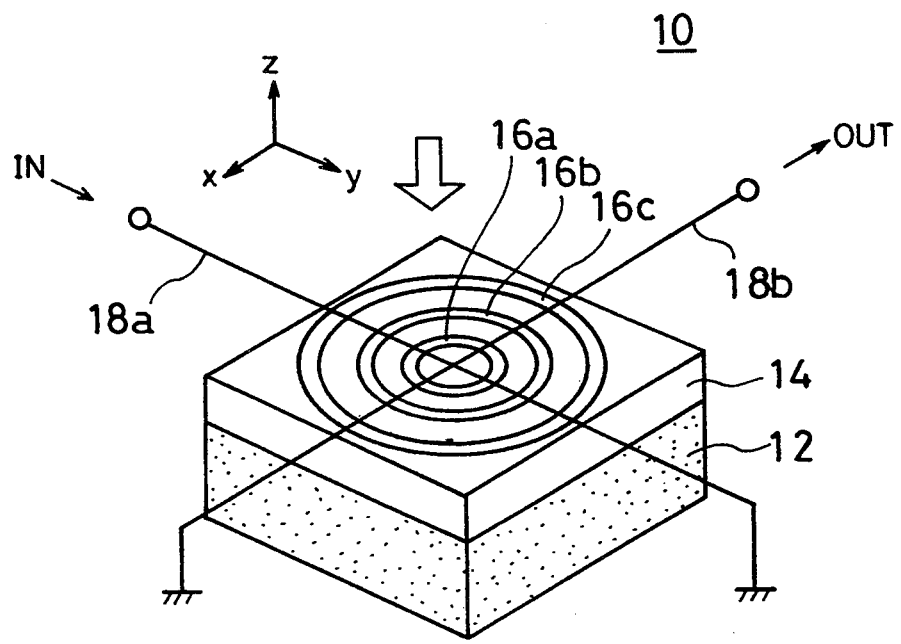
FIG. 1 is a perspective view showing one embodiment of the present invention.

FIG. 1 is a perspective view showing one embodiment of the present invention. The magnetostatic wave resonator 10 includes a GGG substrate 12 having of a square plane, for example, 2 mm×2 mm. On whole one main surface of the GGG substrate 12, a YIG thin film 14 is formed as a ferrimagnetic base, for example, by means of LPE. In this case, a thickness of the GGG substrate 12 and the YIG thin film 14 is formed, for example, in a thickness of 100 μm.

On the YIG thin film 14, three circular conductors 16a, 16b and 16c having different radii are disposed as ring conductors. In this case, the conductors 16a–16c are respectively formed, for example, in a width of 50 μm, on concentric circles whose centers are the center of YIG thin film 14. Though these conductors 16a-16c may be formed directly on the YIG substrate 14 by means of etching or the like, they may be disposed on the YIG thin film 14, for example, by forming a conductive layer (not shown) of copper or the like on one main surface of a dielectric substrate (not shown), and forming the entire shape of the conductors 16a–16c by etching the conductive layer, thereafter, laminating the dielectric substrate on the YIG thin film 14.

Furthermore, on the YIG thin film 14, two transducers 18a and 18b consisting of, for example, single-wire single strip lines are disposed. In this case, the transducers 18a and 18b are disposed so as to intersect with each other at right angles at the center of the YIG thin film 14 and to connect magnetically to the YIG thin film 14.

Figure 2:
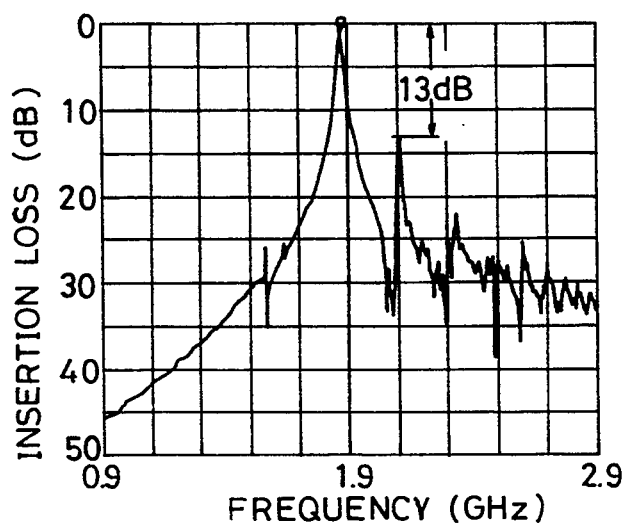
FIG. 2 is a graph showing a frequency characteristic of the embodiment shown in FIG. 1.
Figure 10:
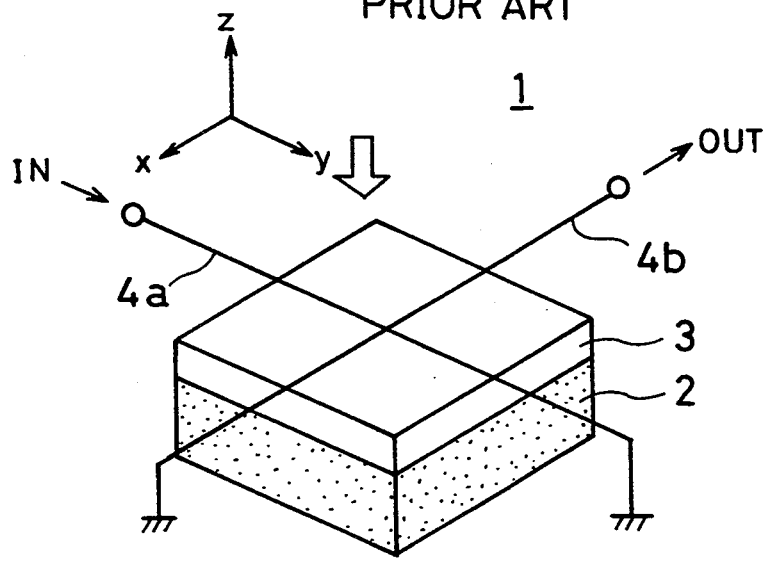
FIG. 10 is a perspective view showing an example of a conventional magnetostatic wave resonator which is a basis of the band-pass filter shown in FIG. 9.
Figure 12:
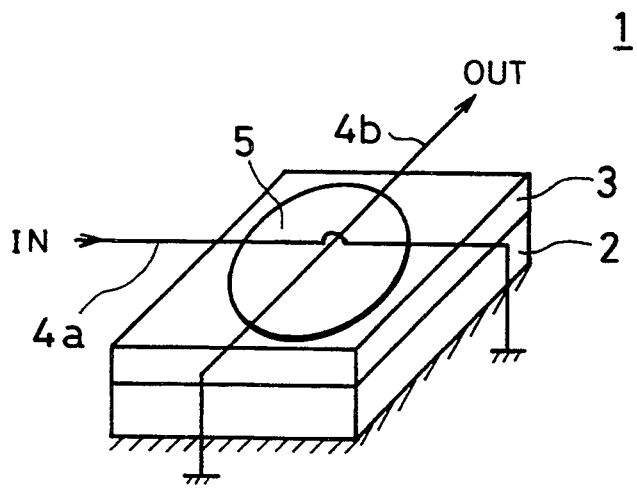
FIG. 12 is a perspective view showing the other example of a conventional magnetostatic wave resonator.
Figure 13:
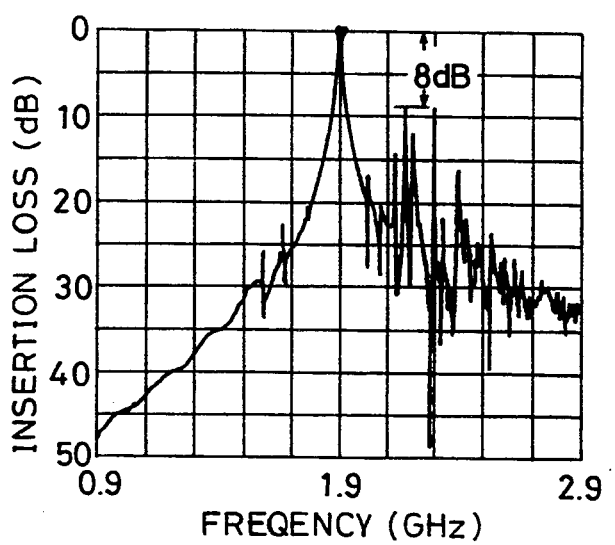
FIG. 13 is a graph showing a frequency characteristic of the magnetostatic wave resonator shown in FIG. 12.

In the magnetostatic wave resonator 10, as showing its frequency characteristic in FIG. 2, the higher modes are suppressed as compared with the conventional magnetostatic wave resonators shown in FIG. 10 and FIG. 12. This is because that, the ring conductors 16a–16c on the YIG thin film 14 or the ferrimagnetic base operate to suppress the higher mode standing waves of the magnetostatic wave in the ferrimagnetic base, without confining the magnetostatic wave in the ferrimagnetic base. The ring conductor 16a having a smaller radius is effective for the higher modes close to the main mode, and the ring conductor 16c having a larger radius is effective for the more higher modes.

Next, in the magnetostatic wave resonator according to the present invention, a principle wherein the ring conductor on the ferrimagnetic base suppresses the higher mode standing wave of the magnetostatic wave in the ferrimagnetic base is described in detail.

In the conventional magnetostatic wave resonator 1 shown in FIG. 10, the standing wave of the magnetostatic wave is excited in the YIG thin film 3 for resonance. By distributions of the standing wave at this time, a number of modes exist in the YIG thin film 3. Explaining a YIG thin film having a square plane, a main mode is the (1, 1) mode and higher modes are represented by (m, n), where $m \geq 1$ and $n \geq 1$, $m=n=1$ is excluded. Hereupon, m indicates the number of standing waves in a direction x and n indicates the number of standing waves in a direction y.

Figure 11:
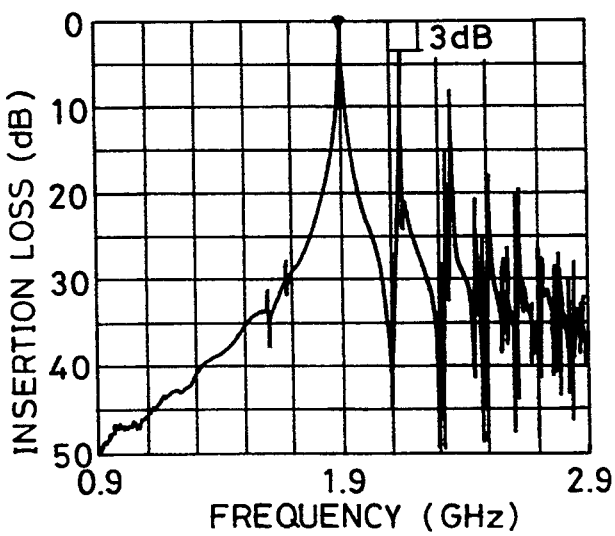
FIG. 11 is a graph showing a frequency characteristic of the magnetostatic wave resonator shown in FIG. 10.

In the frequency characteristic shown in FIG. 11 of the magnetostatic wave resonator 1 shown in FIG. 10, the main mode is the (1, 1) mode and the higher modes are represented by (1, 3), (3, 1) . . . . The reason is that, since the transducers 4a and 4b are disposed at the center of the YIG thin film 3, modes wherein m or n is an even number are not excited.

The difference between the main mode and the higher mode is the difference in the standing wave distributions in the ferrimagnetic base. By utilizing the difference, the higher mode is suppressed by the ring conductor on the ferrimagnetic base in the present invention.

Figure 3:
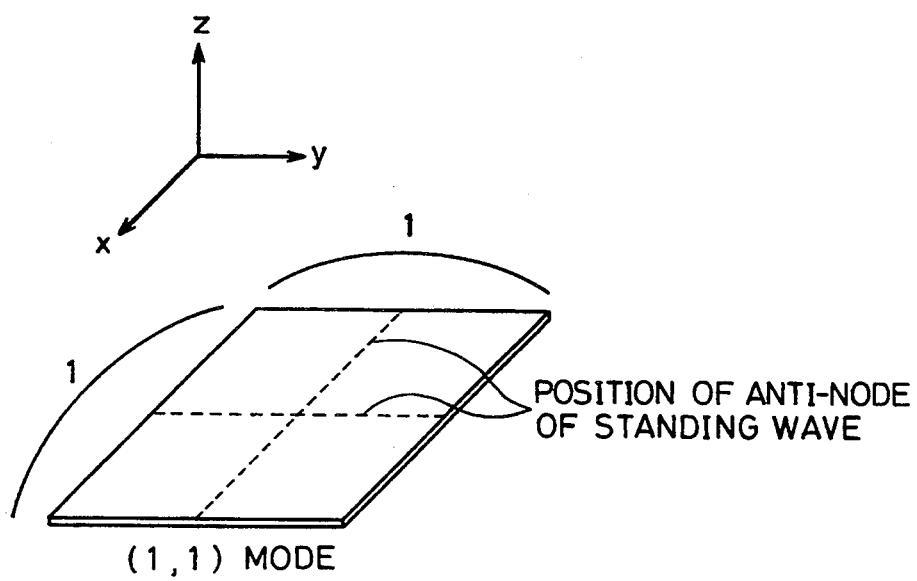
FIG. 3 is an illustrative view showing a main mode standing wave distribution of the magnetostatic wave in the YIG thin film.
Figure 4:
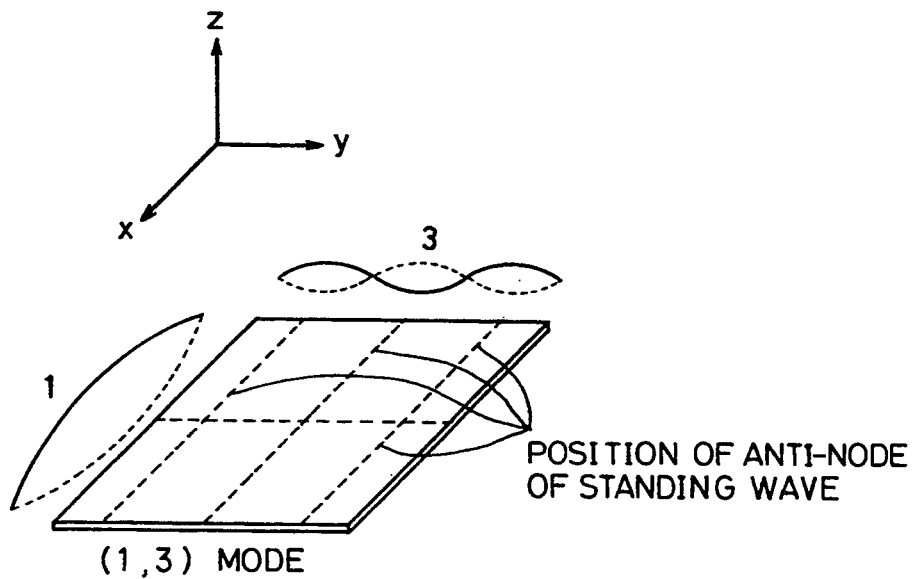
FIG. 4 is an illustrative view showing a higher mode standing wave distribution of the magnetostatic wave in the YIG thin film.

For the sake of qualitative description, the standing wave distribution of the (1, 1) mode which is the main mode of the magnetostatic wave in the YIG thin film is shown in FIG. 3, and the standing wave distribution of the (1, 3) mode which is the higher mode of the magnetostatic wave in the YIG thin film is shown in FIG. 4. In the practical magnetostatic wave resonator, amplitude of the magnetostatic wave at end faces of the YIG thin film is not zero.

Referring to FIG. 3 and FIG. 4, in the (1, 3) mode, one standing wave is generated in a direction x in the YIG thin film, and three standing waves are generated in a direction y. Though there are three anti-nodes in the standing wave in the direction y, since the center one among the three anti-nodes is at the common position with the (1, 1) mode, it is not desirable to place the conductor at this position because the main mode is largely affected. Therefore, the (1, 3) mode is suppressed by placing the conductor at the positions of the anti-nodes on both sides of the (1, 3) mode.

The (3, 1) mode exists at the same frequency as the (1, 3) mode, and the standing wave distribution of the (3, 1) mode is same as that of the (1, 3) mode, in which an x-axis and a y-axis are replaced with each other. Therefore, the (3, 1) mode can also be suppressed by placing the conductor, similarly, at the positions of the anti-nodes on both sides. The width of the conductor may preferably be selected to exert a small effect on the main mode and to strengthen the suppression degree for the higher modes.

Now, the reason why the conductor has the shape of a ring is described.

In the above-mentioned description, though the anti-node position of the standing wave is described as in parallel with the side face of the YIG thin film, in fact, due to the effect of a demagnetizing filed which is a form factor of the YIG thin film, the magnetic field distribution in the YIG thin film is not uniform, particularly, the internal magnetic field is weakened in the vicinity of corners of the YIG thin film. Therefore, the anti-node position of the standing wave is not in parallel with the side face of the YIG thin film, but bends slightly inward in the vicinity of corners of the YIG thin film. That is, it approaches to the shape of a ring.

Figure 5:
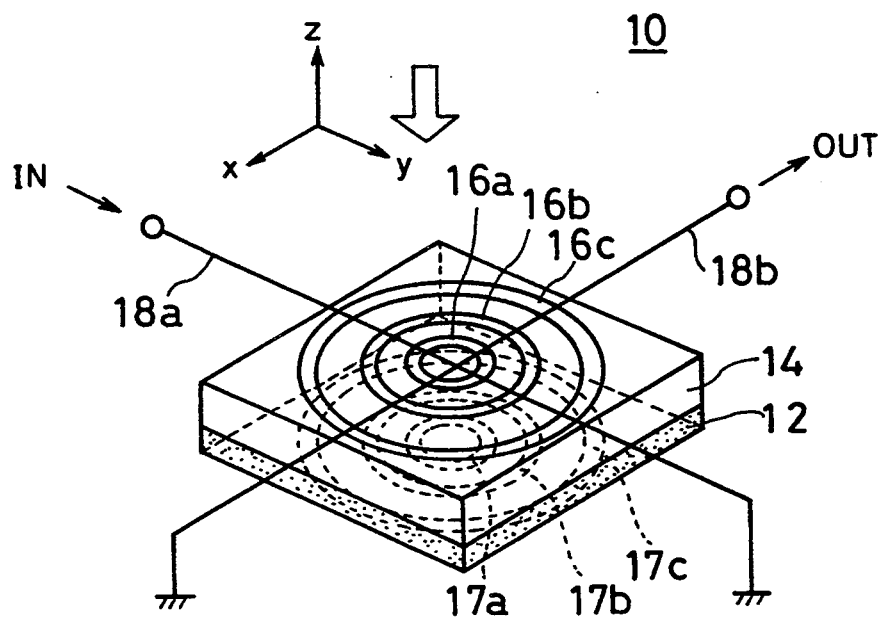
FIG. 5 is a perspective view showing another embodiment of the present invention.

FIG. 5 is a perspective view showing another embodiment of the present invention. In the magnetostatic wave resonator 10 of the embodiment, as compared with the embodiment shown in FIG. 1, particularly, three circular conductors 17a, 17b and 17c having different radii are disposed also on the other main surface of the GGG substrate 12 as ring conductors. In this case, the conductors 17a–17c are disposed so as to correspond to the conductors 16a–16c on the YIG thin film 14. In this embodiment, in order to bring the conductors 17a–17c close to the YIG thin film 14, the thickness of the GGG substrate 12 and the YIG thin film 14 is formed thinner as about 50 μm by grinding the GGG substrate 12.

Figure 6:
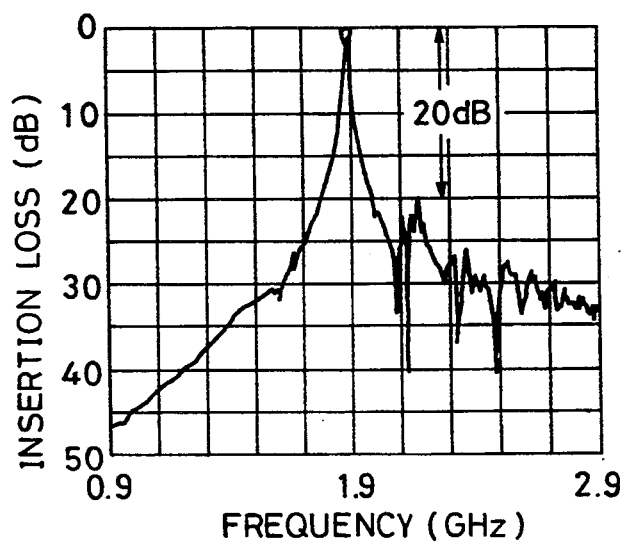
FIG. 6 is a graph showing a frequency characteristic of the embodiment shown in FIG. 5.

In the embodiment shown in FIG. 5, as showing its frequency characteristic in FIG. 6, as compared with the embodiment shown in FIG. 1, the higher mode is further suppressed. As the embodiment shown in FIG. 5, when the ring conductors are provided not only on one main surface of the YIG thin film 14 but also on the other main surface side thereof, the higher mode is further suppressed.

Figure 7:
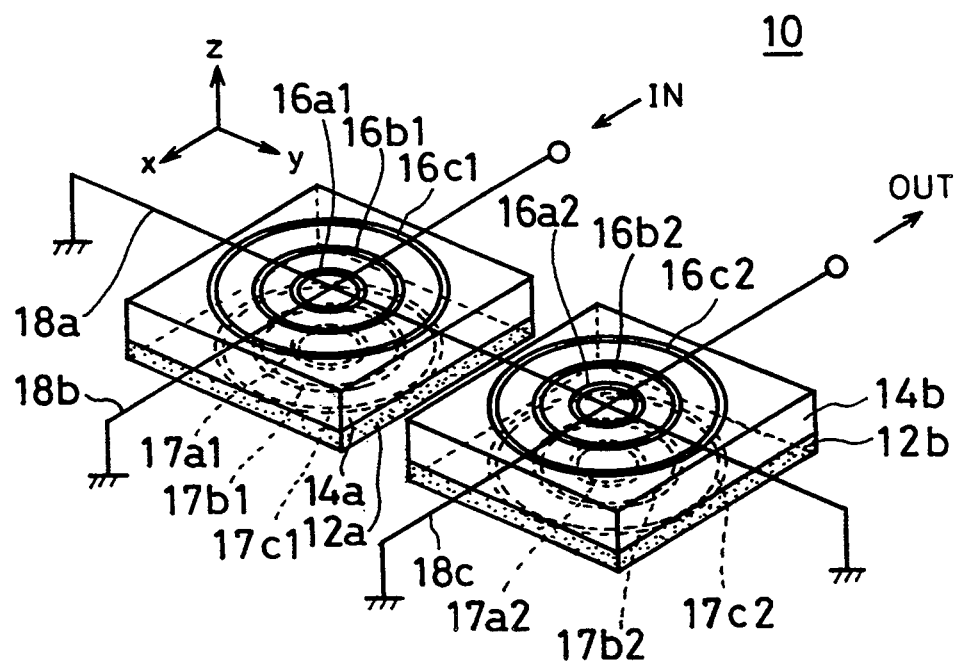
FIG. 7 is a perspective view showing still another embodiment of the present invention.

FIG. 7 is perspective view showing still another embodiment of the present invention. The magnetostatic wave resonator 10 of this embodiment is constituted by connecting the magnetostatic wave resonator shown in FIG. 5 in two stages. That is, in the embodiment shown in FIG. 7, two sets of GGG substrates and YIG thin films which are same as the GGG substrate and the YIG thin film of the embodiment shown in FIG. 5 are included. One set of the GGG substrate 12a and the YIG thin film 14a is disposed on the substantially same plane in a predetermined interval with the other set of the GGG substrate 12b and the YIG thin film 14b. On the YIG thin film 14a, three circular conductors 16a1, 16b1 and 16c1 having the different radii are disposed concentrically, and similarly, also on the other YIG thin film 14b, three circular conductors 16a2, 16b2, and 16c2 having the different radii are disposed concentrically. Furthermore, on the other main surface of the GGG substrate 12a, corresponding to three circular conductors 16a1, 16b1 and 16c1, three circular conductors 17a1, 17b1 and 17c1 are disposed, and similarly, on the other main surface of the other GGG substrate 12b, corresponding to three circular conductors 16a2, 16b2 and 16c2, three circular conductors 17a2, 17b2 and 17c2 are disposed.

Furthermore, in the embodiment shown in FIG. 7, three transducers 18a, 18b and 18c consisting of single-wire single strip lines are disposed on the YIG thin films 14a and 14b. In this case, the transducer 18a is disposed along a straight line connecting centers of the YIG thin film 14a and the other YIG thin film 14b, the other transducer 18b is disposed so as to intersect at right angles with the transducer 18a at the center of the YIG thin film 14a, and still other transducer 18c is disposed so as to intersect at right angles with the transducer 18a at the center of other YIG thin film 14b. The transducer 18a is disposed so as to connect magnetically to two YIG thin films 14a and 14b, the other transducer 18b is disposed so as to connect magnetically to the YIG thin film 14a, and still other transducer 18c is disposed so as to connect magnetically to the other YIG thin film 14b. In this embodiment, opposite ends of the transducer 18a are grounded and the other two transducers 18b and 18c are used for input and output.

Figure 8:
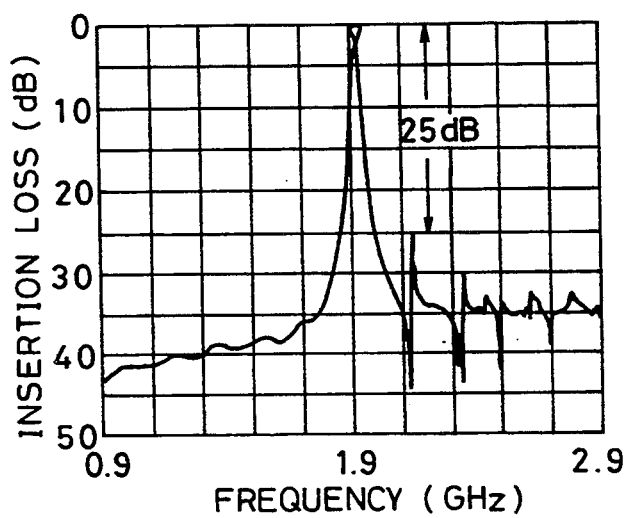
FIG. 8 is a graph showing a frequency characteristic of the embodiment shown in FIG. 7.
Figure 9:
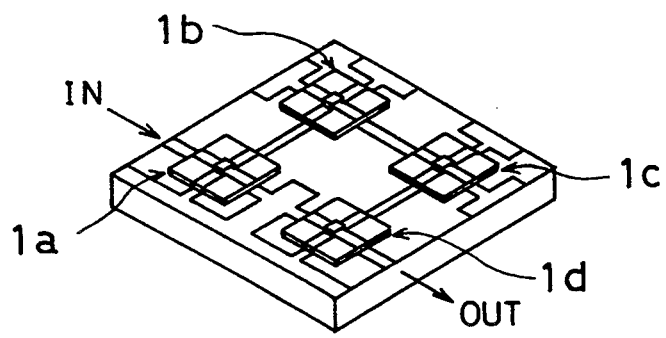
FIG. 9 is a perspective view showing an example of a conventional band-pass filter which is a background of the present invention.

In the embodiment shown in FIG. 7, as showing its frequency characteristic in FIG. 8, the higher mode is more suppressed as compared with the embodiment shown in FIG. 5. When the magnetostatic wave resonator is constituted in two stages as the embodiment shown in FIG. 7, the higher mode is more suppressed.

Though the YIG thin film having the square plane is used in the aforementioned embodiments, the shape of the YIG thin film is not limited to the square, but may be a rectangle or a circle, the shape can be changed optionally.

Though the YIG thin film is used as the ferrimagnetic base in the aforementioned embodiments, the other ferrimagnetic base may also be used.

Furthermore, the ring conductors are disposed triply in the aforementioned embodiments, depending on the suppressing degree of the higher mode, insertion losses and so on, the ring conductor may be provided, besides triply, in single, double, quadruple or more.

Though the width of the ring conductor is decided by the suppressing degree of the higher mode, insertion losses and so on, since the main mode is affected when the width is large, it is preferable to decide below 1 mm or so.

The ring conductor may not necessarily be circular, it may be changed to any shapes, for example, such as a quadrilateral so as to heighten the suppressing degree of the higher mode.

Furthermore, the ring conductor may not always be annular, it may be cut partially.

A material of the ring conductor may not necessarily be a metal, and same effects can also be obtained by the material having a conductivity such as a resistor and a conductive paste.

Meanwhile, though the ring conductor may be disposed tightly on the ferrimagnetic base, it may also be disposed at a distance from the ferrimagnetic base. However, since the effect of suppressing the higher mode by the ring conductor is deteriorated if the distance is too large, it is preferable to keep the distance within about five times of the thickness of the ferrimagnetic base.

The position where the ring conductor is formed is not limited to the center of the ferrimagnetic base, it may be changed depending on the shape of the ferrimagnetic base, the suppressing degree of the higher mode and so on.

Furthermore, a transducer is not limited to a single-wire single strip line, double-wire parallel strip lines may also be used.

It will be apparent from the foregoing that, while the present invention has been described in detail and illustrated, these are only particular illustrations and examples and the invention is not limited to these. The spirit and scope of the invention is limited only by the appended claims.

What is claimed is:

1. A magnetostatic wave resonator comprising:
   a ferrimagnetic base;
   at least one ring conductor formed on one main surface of said ferrimagnetic base; and
   at least two transducers that intersect one another on said one main surface of said ferrimagnetic base and coupled magnetically to said ferrimagnetic base for exciting a magnetostatic wave in said ferrimagnetic base having a main mode and a higher mode standing wave, and for receiving said magnetostatic wave, whereby said higher mode standing wave has an anti-node;
   said ring conductor being positioned at said anti-node.

2. A magnetic wave resonator comprising:
   a ferrimagnetic base;
   a plurality of said ring conductors formed on one main surface of said ferrimagnetic base, said ring conductors being coaxial and radially spaced, and at least two transducers that intersect one another on said one main surface of said ferrimagnetic base and coupled magnetically to said ferrimagnetic base.

3. A magnetostatic wave resonator according to claim 1, wherein said ferrimagnetic base is a YIG thin film.

4. A magnetostatic wave resonator according to claim 3, wherein said YIG thin film is formed on one main surface of a GGG substrate.

5. A magnetostatic wave resonator comprising:
a ferrimagnetic base;
at least one ring conductor formed on one main surface of said ferrimagnetic base; and
at least two transducers that intersect one another on said one main surface of said ferrimagnetic base and coupled magnetically to said ferrimagnetic base;
said ferrimagnetic base being formed on one main surface of a GGG substrate, and
further comprising a ring conductor formed on the other main surface of said GGG substrate.

6. A magnetostatic wave resonator according to claim 5, wherein a plurality of said ring conductors are respectively formed on one main surface of said ferrimagnetic base and said other main surface of said GGG substrate, said ring conductors on each of said one main surface of said ferrimagnetic base and said other main surface being coaxial and radially spaced apart.

7. The magnetostatic wave resonator according to claim 5, wherein said ferrimagnetic base is a YIG thin film.

* * * * *